United States Patent
Wu et al.

(10) Patent No.: US 9,240,781 B2
(45) Date of Patent: Jan. 19, 2016

(54) SHIFT REGISTER, DISPLAY APPARATUS, GATE DRIVING CIRCUIT, AND DRIVING METHOD

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Bo Wu, Beijing (CN); Xiaojing Qi, Beijing (CN); Quanguo Zhou, Beijing (CN); Leisen Nie, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 38 days.

(21) Appl. No.: 14/360,879

(22) PCT Filed: Jun. 28, 2013

(86) PCT No.: PCT/CN2013/078443
§ 371 (c)(1),
(2) Date: May 27, 2014

(87) PCT Pub. No.: WO2014/139249
PCT Pub. Date: Sep. 18, 2014

(65) Prior Publication Data
US 2015/0280704 A1  Oct. 1, 2015

(30) Foreign Application Priority Data

Mar. 14, 2013  (CN) .......................... 2013 1 0082062

(51) Int. Cl.
*G09G 3/36* (2006.01)
*H03K 17/30* (2006.01)
*G11C 27/04* (2006.01)

(52) U.S. Cl.
CPC ............ *H03K 17/302* (2013.01); *G09G 3/3611* (2013.01); *G11C 27/04* (2013.01); *G09G 2310/0286* (2013.01)

(58) Field of Classification Search
None
See application file for complete search history.

(56) References Cited

U.S. PATENT DOCUMENTS

| 8,243,058 B2 | 8/2012 | Lee et al. |
| 2004/0189585 A1 | 9/2004 | Moon |

(Continued)

FOREIGN PATENT DOCUMENTS

| CN | 1899202 A | 1/2007 |
| CN | 101122720 A | 2/2008 |

(Continued)

OTHER PUBLICATIONS

Korean Office Action dated Mar. 20, 2015; Appln. No. 10-2014-7017047.

(Continued)

*Primary Examiner* — Nicholas Lee
(74) *Attorney, Agent, or Firm* — Ladas & Parry LLP

(57) ABSTRACT

A shift register, a display apparatus, a gate driving circuit and a driving method, the shift register comprises a plurality of stages of shift register circuits (SR0-SRn), a $N^{th}$ stage shift register circuit among the plurality of stages of shift register circuits (SR0-SRn) comprises: a pre-charging circuit (1), a pulling-up circuit (2), a resetting circuit (3) and a retaining circuit, the retaining circuit is equipped with an eighth transistor (M8) whose gate is connected with a first control signal terminal (CK), source and drain are connected with each other. Not only a shift registering is realized, but also the operation period of the circuit is decreased, which can address the problem of shift in the voltage thresholds. Further, with the transistor whose source and drain are short-circuited, a control of the control signal on the pulling-down node is realized, so that a potential at the pulling-down node rises rapidly when the first control signal is in the high level and has a reduced descending range when the first control signal is in the low level, which can realize a better control of the circuit.

16 Claims, 5 Drawing Sheets

(56) References Cited

U.S. PATENT DOCUMENTS

2005/0008114 A1     1/2005   Moon
2007/0247932 A1*   10/2007   Tobita .................. G09G 3/3677
                                                              365/189.12
2011/0157263 A1     6/2011   Kim et al.

FOREIGN PATENT DOCUMENTS

| EP | 1 887 554 A1 | 2/2008 |
| --- | --- | --- |
| JP | 2004-295126 A | 10/2004 |
| KR | 20110076450 A | 7/2011 |
| KR | 1020050037657 A | 5/2014 |

OTHER PUBLICATIONS

First Chinese Office Action Appln. No. 201310082062.7; Dated Sep. 5, 2014.

Written Opinion of the International Searching Authority dated May 12, 2013; PCT/CN2013/078443.

Korean Notice of Allowance dated Sep. 29, 2015; Appln. No. 10-2014-7017047.

* cited by examiner

SHIFT REGISTER, DISPLAY APPARATUS, GATE DRIVING CIRCUIT, AND DRIVING METHOD

TECHNICAL FIELD

The present disclosure relates to a field of liquid crystal display, and more particularly, to a shift register, a display apparatus, a gate driving circuit and a driving method.

BACKGROUND

In a Thin Film Transistor Liquid Crystal Display (TFT-LCD), the basic principle for displaying a frame of image is that signals required for each row of pixels are output from up to down sequentially by a data driver, and each row of pixels is gated by inputting thereto a square wave with a certain pulse width from up to down sequentially by a gate driver. An existing manufacture method is to bond a gate driving IC and a data driving IC on a glass panel by means of a chip on glass (COG) process. When a resolution is high, the thin film transistor liquid crystal display with a small size has more outputs of the gate driver and the data driver, and lengths of the driving ICs would increase, which makes against to a laminating process for a module driving ICs. Recently, the gate driving IC is manufactured on the glass panel with an array substrate process without adding any processes and cost to the existing process, by designing of a gate driving circuit. A circuit principle diagram of a shift register unit in a basic gate driving circuit is illustrated in FIG. 1. However, the circuit has a relatively long operation period, has the problem of voltage threshold shift, and fails to control the circuit well by control signals.

SUMMARY

A technical problem to be solved by the present disclosure is how to provide a shift register, a display apparatus, a gate driving circuit and a driving method, which can decrease an operation period of a circuit, address the problem of shifting in voltage thresholds and realize better controlling of the circuit by control signals.

In order to solve the above technical problem, in accordance with an aspect of the present disclosure, there is provided a shift register comprising a plurality of stages of shift register circuits, a $N^{th}$ stage shift register circuit among the plurality of stages of shift register circuits comprises:

a pre-charging circuit for pre-charging a pulling-up circuit;

the pulling-up circuit for enabling an outputting terminal to output a high level after the pre-charging is completed;

a resetting circuit for resetting the $N^{th}$ stage shift register circuit after the outputting terminal outputs the high level;

a retaining circuit for retaining an output potential of the $N^{th}$ stage shift register circuit after the $N^{th}$ stage shift register circuit is reset;

a control terminal and an inputting terminal of the pre-charging circuit are connected with an outputting terminal of a previous stage shift register circuit, an outputting terminal of the pre-charging circuit is connected with an inputting terminal of the resetting circuit;

an inputting terminal of the pulling-up circuit is connected with a first control signal terminal;

a control terminal of the resetting circuit is connected with an outputting terminal of a next stage shift register circuit, an outputting terminal of the resetting circuit is grounded;

the retaining circuit is connected with the outputting terminal of the pre-charging circuit, the inputting terminal of the resetting circuit, a control terminal of the pulling-up circuit and an outputting terminal of the pulling-up circuit, a first control terminal is connected with the first control signal terminal, and a second control terminal is connected with a second control signal terminal;

the retaining circuit is equipped with one transistor whose gate is connected with the first control signal terminal, source and drain are connected with each other.

Optionally, the retaining circuit comprises a first retaining circuit and a second retaining circuit, and the one transistor is disposed in the first retaining circuit.

Optionally, the first retaining circuit further comprises a fifth transistor, the gate of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;

the second retaining circuit comprises a fourth transistor, a sixth transistor and a seventh transistor, a gate of the fourth transistor is the second control terminal of the retaining circuit, a source of the fourth transistor is connected with a source of the sixth transistor and the outputting terminal of the pulling-up circuit, a drain of the fourth transistor is grounded, a gate of the sixth transistor is connected with a gate of the seventh transistor, a drain of the sixth transistor is grounded, a source of the seventh transistor is connected with the outputting terminal of the pre-charging circuit, the inputting terminal of the resetting circuit and the control terminal of the pulling-up circuit, and a drain of the seventh transistor is grounded;

the first retaining circuit is connected with the second retaining circuit through a pulling-down node, the pulling-down node is connected to the source and the drain of the one transistor, the source of the fifth transistor, the gate of the sixth transistor and the gate of the seventh transistor.

Optionally, the first retaining circuit further comprises a fifth transistor, the control terminal of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;

the second retaining circuit comprises a fourth transistor, a sixth transistor and a seventh transistor, a gate of the fourth transistor is the second control terminal of the retaining circuit, a source of the fourth transistor is connected with a source of the seventh transistor and the outputting terminal of the pulling-up circuit, a drain of the fourth transistor is grounded, a gate of the sixth transistor is connected with a gate of the seventh transistor, a source of the sixth transistor is connected with the outputting terminal of the pre-charging circuit, the inputting terminal of the resetting circuit and the control terminal of the pulling-up circuit, a drain of the sixth transistor is connected with a source of the seventh transistor, and a drain of the seventh transistor is grounded;

the first retaining circuit is connected with the second retaining circuit through a pulling-down node, the pulling-down node is connected to the source and the drain of the one transistor, the source of the fifth transistor, the gate of the sixth transistor and the gate of the seventh transistor.

Optionally, the pre-charging circuit comprises a first transistor whose gate is a control terminal, source is an inputting terminal, and drain is an outputting terminal.

Optionally, the resetting circuit comprises a second transistor whose gate is a control terminal, source is an inputting terminal, and drain is an outputting terminal.

Optionally, the pulling-up circuit comprises a third transistor and a capacitor, a gate of the third transistor is a control terminal, a source thereof is an inputting terminal and a drain thereof is an outputting terminal, the gate and the drain of the third transistor are connected with two terminals of the capacitor, respectively.

In accordance with another aspect of the present disclosure, there is further provided a gate driving circuit comprising the shift register.

In accordance with a still aspect of the present disclosure, there is further provided a display apparatus comprising the gate driving circuit.

In accordance with a further aspect of the present disclosure, there is further provided a gate driving method comprises steps of:

S1: pre-charging a pulling-up circuit by a pre-charging circuit;

S2: pulling up a potential of a shift register circuit by the pulling-up circuit, and outputting a high level by the shift register circuit;

S3: resetting the shift register circuit by a resetting circuit;

S4: retaining an output potential of the shift register circuit by a retaining circuit after the shift register circuit is reset;

In the step S4, an equivalent capacitance of a transistor in the retaining circuit varies with the turning on or off of the transistor, and the equivalent capacitance when the transistor is turned on is greater than the equivalent capacitance when the transistor is turned off.

In the shift register, the display apparatus, the gate driving circuit and the driving method according to embodiments of the present disclosure, not only a shift registering is realized, but also the operation period of the circuit is decreased, which can address the problem of shifting in the voltage thresholds. Further, with the transistor whose source and drain are short-circuited, the controlling the pulling-down node by the control signal is realized, so that a potential at the pulling-down node rises rapidly when the first control signal is at the high level and has a reduced descending range when the first control signal is at the low level thereby the better controlling of the circuit by the control signal can be realized.

DETAILED DESCRIPTION

Specific implementations of the present disclosure will be further described in details in connection with drawings and embodiments bellow. Following embodiments are only used for explaining the principle of the present disclosure but not for limiting the scope of the present disclosure.

First Embodiment

Figure 1:
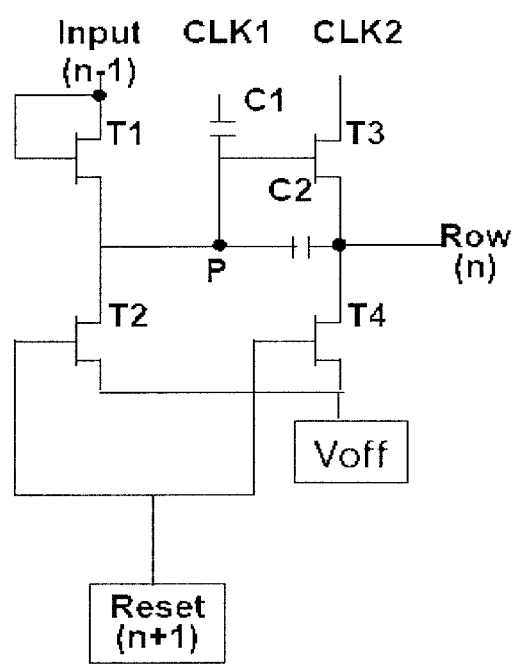
FIG. 1 is a schematic diagram illustrating a principle of a shift register unit circuit of a GOA circuit as known.
Figure 2:
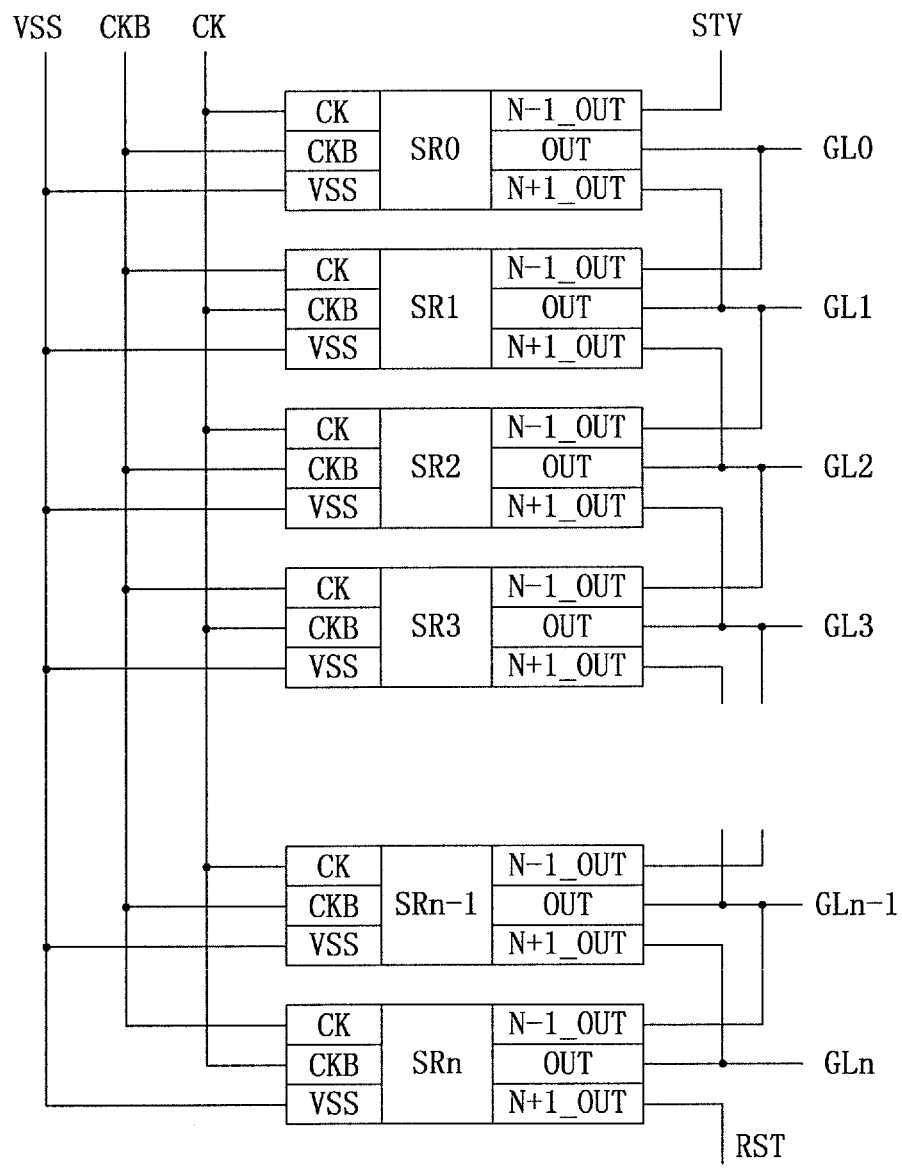
FIG. 2 is a schematic diagram illustrating a principle of a shift register circuit according to embodiments of the present disclosure.

A shift register according to the present embodiment comprises a plurality of stages of shift register circuits. As illustrated in FIG. 2, SR0-SRn in the figure denote each stage of n stages of shift register circuits, respectively, GL0-GLn are outputting terminals of the n stages of shift register circuits, STV is a start signal. There use, in each stage of shift register circuit, an output from the previous stage as a STV start signal, and an output from the next stage as a reset signal RST, The n stages of shift register circuits operate under dual clocks, CK and CKB, and realize a scanning output of the gate driving from up to down.

Figure 3:
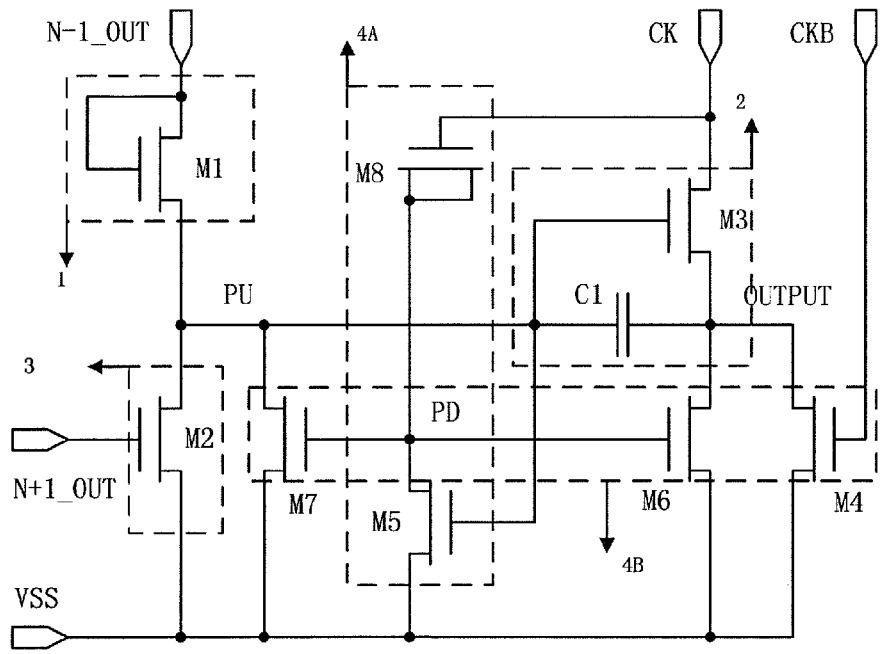
FIG. 3 is a schematic diagram illustrating a circuit principle of the shift register unit according to a first embodiment of the present disclosure.

As illustrated in FIG. 3, a $N^{th}$ stage shift register circuit among the plurality of stages of shift register circuits comprises:

a pre-charging circuit 1 for pre-charging a pulling-up circuit;

the pulling-up circuit 2 for enabling an outputting terminal OUTPUT to output a high level after the pre-charging is completed;

a resetting circuit 3 for resetting the $N^{th}$ stage shift register circuit after the outputting terminal OUTPUT outputs the high level;

a retaining circuit for retaining an output potential of the $N^{th}$ stage of shift register circuit after the $N^{th}$ stage of shift register circuit is reset;

where N is a nature number greater than 1.

A control terminal and an inputting terminal of the pre-charging circuit 1 are connected with an outputting terminal N−1_OUT of the previous stage of shift register circuit, an outputting terminal thereof is connected with an inputting terminal of the resetting circuit 3;

an inputting terminal of the pulling-up circuit 2 is connected with a first control signal terminal CK;

a control terminal of the resetting circuit 3 is connected with an outputting terminal N+1_OUT of a next stage shift register circuit, and an outputting terminal thereof is grounded;

the retaining circuit is connected with the outputting terminal of the pre-charging circuit 1, the inputting terminal of the resetting circuit 3, a control terminal of the pulling-up circuit 2 and an outputting terminal of the pulling-up circuit 2, a first control terminal is connected with the first control signal terminal CK, and a second control terminal is connected with a second control signal terminal CKB;

the retaining circuit is equipped with an eighth transistor M8 whose gate is connected with the first control signal terminal, source and drain are connected with each other.

The retaining circuit comprises a first retaining circuit 4A and a second retaining circuit 4B, and the eighth transistor M8 is disposed in the first retaining circuit 4A.

The first retaining circuit 4A comprises a fifth transistor M5 and the eighth transistor M8, the control terminal of the eighth transistor M8 is the first control terminal of the retaining circuit, the source and the drain of the eighth transistor M8 are connected with a source of the fifth transistor M5, a gate of the fifth transistor M5 is connected with the control terminal of the pulling-up circuit 2, and a drain of the fifth transistor M5 is grounded;

the second retaining circuit 4B comprises a fourth transistor M4, a sixth transistor M6 and a seventh transistor M7, a gate of the fourth transistor M4 is the second control terminal of the retaining circuit, a source of the fourth transistor M4 is connected with a source of the sixth transistor M6 and the outputting terminal of the pulling-up circuit 2, a drain of the fourth transistor M4 is grounded, a gate of the sixth transistor M6 is connected with a gate of the seventh transistor M7, a drain of the sixth transistor M6 is grounded, a source of the seventh transistor M7 is connected with the outputting terminal of the pre-charging circuit 1, the inputting terminal of the resetting circuit 3 and the control terminal of the pulling-up circuit 2, and a drain of the seventh transistor M7 is grounded;

the first retaining circuit 4A is connected with the second retaining circuit 4B through a pulling-down node PD which is connected to the source and the drain of the eighth transistor M8, the source of the fifth transistor M5, the gate of the sixth transistor M6 and the gate of the seventh transistor M7.

In the drawings, PU denotes a pulling-up node while PD denotes the pulling-down node, and signals inputted from the first control signal terminal CK and the second control signal terminal CKB are dual-clock signals inputted differentially.

In the exemplary embodiment, the pre-charging circuit 1 comprises a first transistor M1 whose gate is a control terminal, source is an inputting terminal and drain is an outputting terminal.

The resetting circuit 3 comprises a second transistor M2 whose gate is a control terminal, source is an inputting terminal and drain is an outputting terminal.

The pulling-up circuit 2 comprises a third transistor M3 and a capacitor C1, a gate of the third transistor M3 is a control terminal, a source thereof is an inputting terminal and a drain thereof is an outputting terminal, the gate and the drain of the third transistor M3 are connected with two terminals of the capacitor C1, respectively.

Optionally, the transistors described above (the first transistor, the second transistor, the third transistor, the fourth transistor, the fifth transistor, the sixth transistor, the seventh transistor and the eighth transistor) are thin film transistors.

Figure 4:
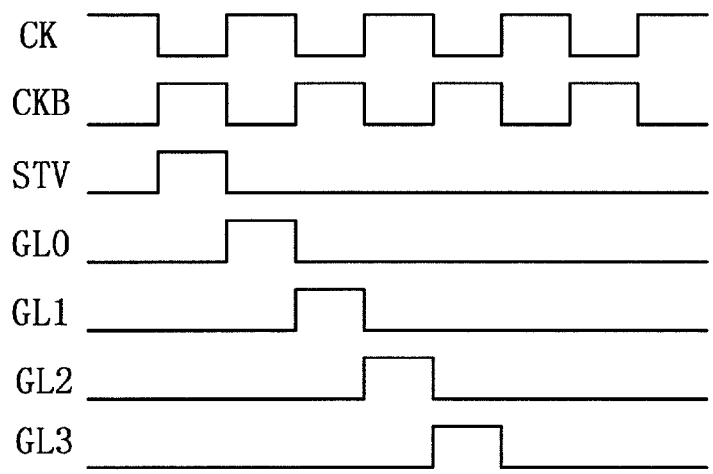
FIG. 4 is a timing waveform diagram of the shift register unit circuit according to the embodiments of the present disclosure.

Specifically, in the shift register according to the first embodiment of the present disclosure, as illustrated in FIG. 4, in the first period of clock signal, the first control signal terminal CK outputs a low level, the second control signal terminal CKB outputs a high level, the output N−1_OUT of the previous stage shift register circuit is the high level, and the output N+1_OUT of the next stage shift register circuit is the low level. The transistors M2, M6, M7 and M8 are turned off, while the transistors M1 and M4 are turned on. The output N−1_OUT of the previous stage shift register circuit pre-charges the gate of the transistor M3 via the transistor M1, so that the voltage at the pulling-up node PU rises. The second control signal terminal CKB is at the low level, and the pulling-up node PU pulls down the pulling-down node PD, so that the voltage at the pulling-down node PD is at a low level, both of the transistors M6 and M7 are turned off thereby the gate of the transistor M3 (pulling-up node PU) is kept in a pre-charging state, and a voltage at the outputting terminal OUTPUT remains at the low level.

In the second period of clock signal, after the circuit is pre-charged, the first control signal terminal CK outputs the high level, the second control signal terminal CKB outputs the low level, the output N−1_OUT of the previous stage shift register circuit is the low level, and the output N+1_OUT of the next stage shift register circuit is the low level. The transistors M1, M2 and M4 are turned off. The pulling-up node PU rises due to the boost effect of the capacitor C1, the transistor M3 is turned on, and the outputting terminal OUTPUT outputs the high level signal. The source and drain of the transistor M8 are short-circuited, so that the transistor M8 is equivalent to a capacitor and the potential at the pulling-down node PD varies with the signal of the first control signal terminal CK. At this time, the pulling-up node PU is at the high level, the transistor M5 is turned on, weight-length ratios of the transistors M8 and M5 make the potential at the pulling-down node PD be low, and the transistors M7, M8 are turned off. In this stage, the magnitude of the equivalent capacitance of the transistor M8 is consistent with the equivalent capacitance as the transistor is turned on. The pulling-up node PU remains at the high level, and the outputting terminal OUTPUT is retained to output the high level thereby the signal of the output N−1_OUT of the previous stage of shift register circuit is shifted.

In the third period of clock signal, the output N−1_OUT of the previous stage shift register circuit is at the low level, the first control signal terminal CK is at the low level, the second control signal terminal CKB is at the high level, the output N+1_OUT of the next stage shift register circuit is at the high level, the transistor M1 is turned off, and the transistors M2 and M4 are turned on. The pulling-up node PU and the outputting terminal OUTPUT are reset to the low level.

In the fourth period of clock signal, the output N−1_OUT of the previous stage shift register circuit is at the low level, the output N+1_OUT of the next stage shift register circuit is at the low level, the first control signal terminal CK is at the high level, and the second control signal terminal CKB is at the low level. The transistors M1, M2 and M4 are turned off, the pulling-up node PU is at the low level, and the transistors M3 and M5 are turned off. The source and the drain of the transistor M8 are short-circuited, so that the transistor M8 is equivalent to a capacitor. The first control signal terminal CK is at the high level, the pulling-down node PD couples with the high level at the first control signal terminal CK via the transistor M8, thus the transistors M6 and M7 are turned on, and the pulling-up node PU and the outputting terminal OUTPUT are pulled down to the low level. In this stage, the magnitude of the equivalent capacitor of the transistor M8 is consistent with the equivalent capacitor when the transistor is turned on, and is greater than the equivalent capacitance when the transistor is turned off.

In a fifth period of clock signal, the output N−1_OUT of the previous stage shift register circuit is at the low level, the output N+1_OUT of the next stage shift register circuit is at the low level, the first control signal terminal CK is at the low level, and the second control signal terminal CKB is at the high level. The transistors M1 and M2 are turned off, the pulling-up node PU is at the low level, and the transistors M3 and M5 are turned off. The transistor M4 is turned on, and the outputting terminal OUTPUT is pulled down to the low level. The source and the drain of the transistor M8 are short-circuited, so that the transistor M8 is equivalent to a capacitor. The first control signal terminal CK is at the low level, the pulling-down node PD couples with the low level at the first control signal terminal CK via the transistor M8. In this stage, the magnitude of the equivalent capacitor of the transistor M8 is consistent with the equivalent capacitor when the transistor is turned off, and is smaller than the equivalent capacitance when the transistor is turned on.

Figure 5:
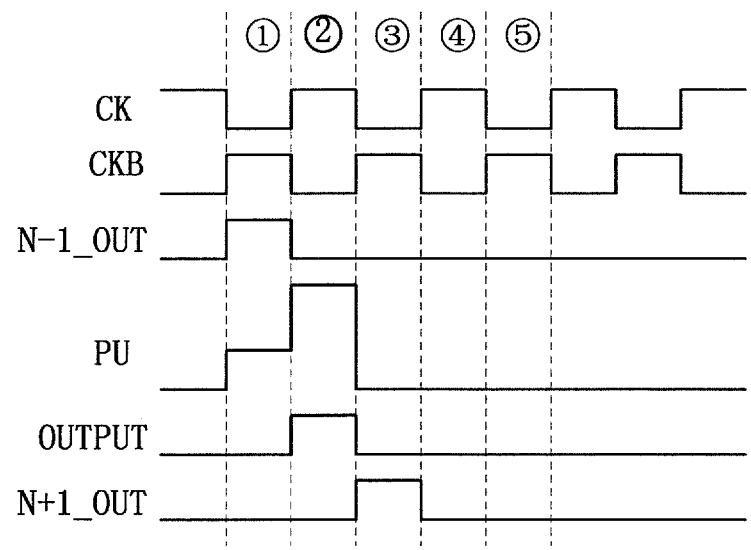
FIG. 5 is a timing waveform diagram of the shift register circuit according to the embodiments of the present disclosure.

A timing waveform diagram of the shift register circuit according to the embodiment of the present disclosure is illustrated in FIG. 5, and in the drawings, STV denotes a start signal, and GL0-GLn are the outputting terminals of the n stages of shift register circuits, respectively.

In the shift register according to embodiment of the present disclosure, the operation period of the circuit is decreased, which can address the problem of shift in the voltage thresholds. Further, with the transistor whose source and drain are short-circuited, the controlling of the pulling-down node by the control signal is realized, so that a potential at the pulling-down node rises rapidly when the first control signal is at the high level and has a reduced descending range when the first control signal is at the low level, which can realize the control of the circuit by the control signal even better.

Second Embodiment

Figure 6:
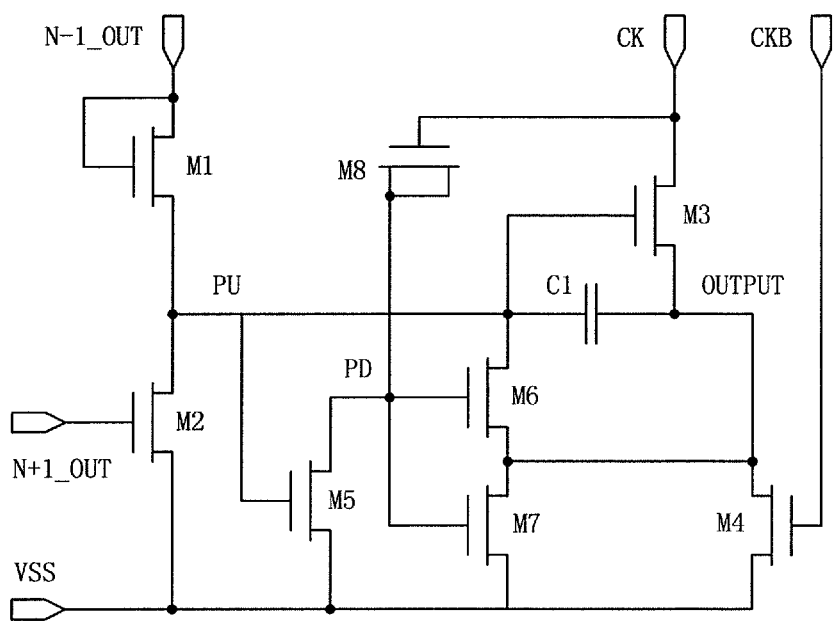
FIG. 6 is a schematic diagram illustrating a circuit principle of a shift register unit according to a second embodiment of the present disclosure.

There is illustrated in FIG. 6 a shift register according to the present embodiment of the present disclosure, which is substantively the same as the First Embodiment, except that: the first retaining circuit 4A comprises a fifth transistor M5 and the eighth transistor M8, the control terminal of the eighth transistor M8 is the first control terminal of the retaining circuit, the source and the drain of the eighth transistor M8 are connected with a source of the fifth transistor M5, a gate of the fifth transistor M5 is connected with the control terminal of the pulling-up circuit, and a drain of the fifth transistor M5 is grounded;

the second retaining circuit 4B comprises a fourth transistor M4, a sixth transistor M6 and a seventh transistor M7, a gate of the fourth transistor M4 is the second control terminal of the retaining circuit, a source of the fourth transistor M4 is connected with a source of the seventh transistor M7 and the outputting terminal of the pulling-up circuit 2, a drain of the fourth transistor M4 is grounded, a gate of the sixth transistor M6 is connected with a gate of the seventh transistor M7, a source of the sixth transistor M6 is connected with the outputting terminal of the pre-charging circuit 1, the inputting terminal of the resetting circuit 3 and the control terminal of the pulling-up circuit 2, a drain of the sixth transistor M6 is connected with a source of the seventh transistor M7, and a drain of the seventh transistor M7 is grounded;

the first retaining circuit 4A is connected with the second retaining circuit 4B through a pulling-down node PD, the pulling-down node PD is connected to the source and the drain of the eighth transistor, the source of the fifth transistor, the gate of the sixth transistor and the gate of the seventh transistor.

With an effect of capacitor coupling realized by the transistor whose source and drain are short-circuited, schemes of the embodiments of the present disclosure may be various. For example, a GOA bi-direction scan can be realized by the designing of the pre-charging circuit module and the resetting circuit module, the pulling-up node PU and the outputting terminal OUTPUT can be pulled down to the output of the previous or next stage shift register circuit by suitable designs, or the four clock circuits according to the present disclosure are utilized. Any solutions achieving the effect of capacitance coupling by the transistor whose source and drain are short-circuited according to the embodiments of the present disclosure should be considered as falling into the scope of the present disclosure.

A gate driving circuit of the embodiments of the present disclosure comprises the shift register.

A display apparatus of the embodiments of the present disclosure comprises the gate driving circuit.

Figure 7:
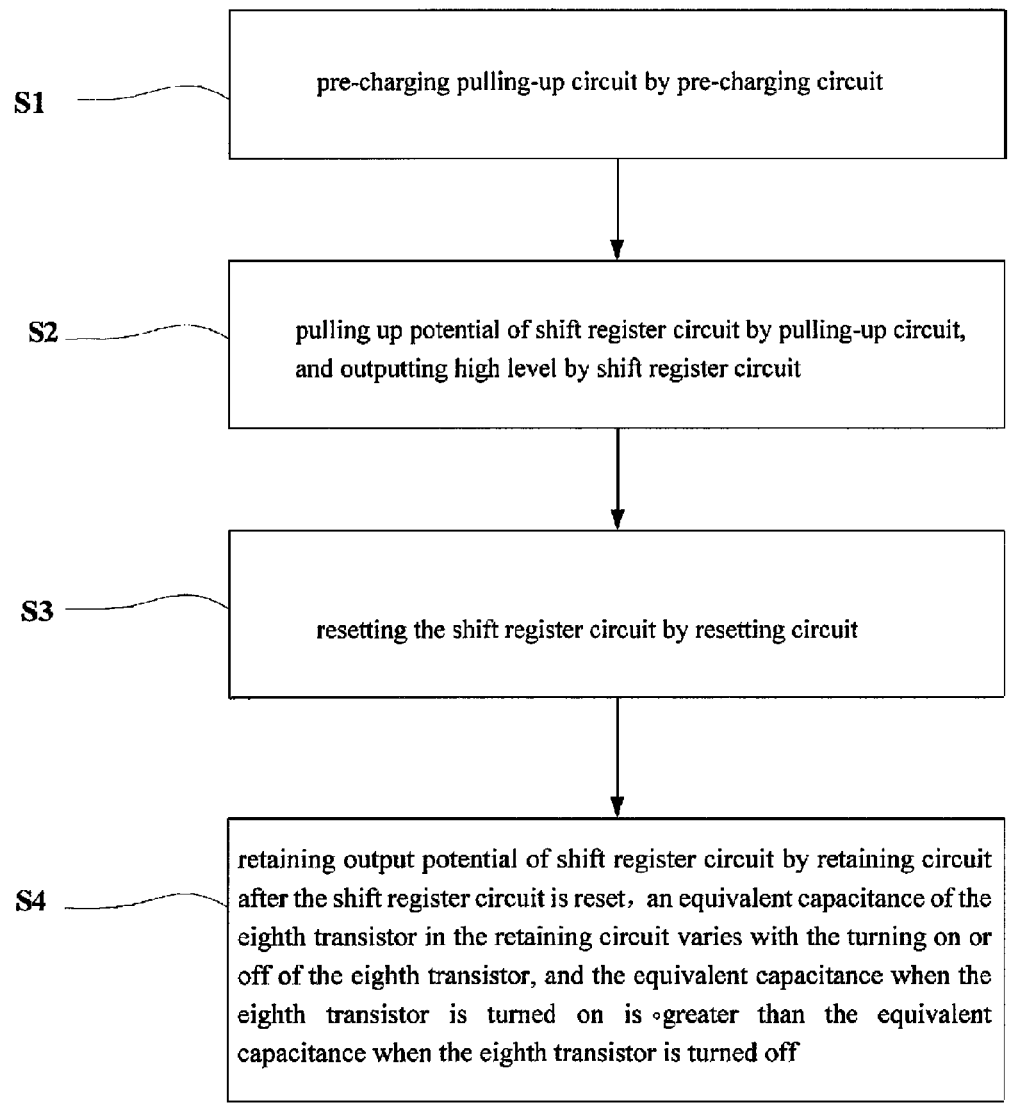
FIG. 7 is a schematic diagram illustrating steps of a gate driving method according to the embodiments of the present disclosure.

FIG. 7 is a schematic diagram illustrating steps of a gate driving method according to the embodiments of the present disclosure. As illustrated in FIG. 7, operation processes of the method are as follows.

In a step S1, a pre-charging circuit pre-charges a pulling-up circuit;

in a step S2, the pulling-up circuit pulls up a potential of a shift register circuit, and the shift register circuit outputs a high level;

in a step S3, a resetting circuit resets the shift register circuit; and in a step S4, a retaining circuit retains an output potential of the shift register circuit after the shift register circuit is reset.

In the step S4, an equivalent capacitance of an eighth transistor in the retaining circuit varies as the eighth transistor is turned on or off, and the equivalent capacitance as the eighth transistor is turned on is greater than the equivalent capacitance as the eighth transistor is turned off.

The above embodiments are only illustrative, and in no way limit the scope of the present disclosure. Those skilled in the art can make various modifications and variations without departing from the spirit and scope of the present disclosure. Such modifications and variations are intended to be covered by scope of the present disclosure. Therefore, the protection of the present disclosure should be defined by the following claims.

What is claimed is:

1. A shift register comprising a plurality of stages of shift register circuits, a $N^{th}$ stage shift register circuit among the plurality of stages of shift register circuits comprising:
    a pre-charging circuit for pre-charging a pulling-up circuit;
    the pulling-up circuit for enabling an outputting terminal to output a high level after the pre-charging is completed;
    a resetting circuit for resetting the $N^{th}$ stage shift register circuit after the outputting terminal outputs the high level;
    a retaining circuit for retaining an output potential of the $N^{th}$ stage shift register circuit after the $N^{th}$ stage shift register circuit is reset;
    a control terminal and an inputting terminal of the pre-charging circuit are connected with an outputting terminal of a previous stage shift register circuit, an outputting terminal thereof is connected with an inputting terminal of the resetting circuit;
    an inputting terminal of the pulling-up circuit is connected with a first control signal terminal;
    a control terminal of the resetting circuit is connected with an outputting terminal of a next stage shift register circuit, an outputting terminal thereof is grounded;
    the retaining circuit is connected with the outputting terminal of the pre-charging circuit, the inputting terminal of the resetting circuit, a control terminal of the pulling-up circuit and an outputting terminal of the pulling-up circuit, a first control terminal is connected with the first control signal terminal, and a second control terminal is connected with a second control signal terminal; and
    the retaining circuit is equipped with one transistor whose gate is connected with the first control signal terminal, source and drain are connected with each other.

2. The shift register of claim 1, wherein the retaining circuit comprises a first retaining circuit and a second retaining circuit, and the one transistor is disposed in the first retaining circuit.

3. The shift register of claim 2, wherein the first retaining circuit further comprises a fifth transistor, the gate of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;
    the second retaining circuit comprises a fourth transistor, a sixth transistor and a seventh transistor, a gate of the fourth transistor is the second control terminal of the retaining circuit, a source of the fourth transistor is connected with a source of the sixth transistor and the outputting terminal of the puffing-up circuit, a drain of the fourth transistor is grounded, a gate of the sixth transistor is connected with a gate of the seventh transistor, a drain of the sixth transistor is grounded, a source of the seventh transistor is connected with the outputting terminal of the pre-charging circuit, the inputting terminal of the resetting circuit and the control terminal of the pulling-up circuit, and a drain of the seventh transistor is grounded; and the first retaining circuit is connected with the second retaining circuit through a pulling-down node which is connected to the source and the drain of the one transistor, the source of the fifth transistor, the gate of the sixth transistor and the gate of the seventh transistor.

4. The shift register of claim 2, wherein the first retaining circuit further comprises a fifth transistor, the control terminal of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;

the second retaining circuit comprises a fourth transistor, a sixth transistor and a seventh transistor, a gate of the fourth transistor is the second control terminal of the retaining circuit, a source of the fourth transistor is connected with a source of the seventh transistor and the outputting terminal of the pulling-up circuit, a drain of the fourth transistor is grounded, a gate of the sixth transistor is connected with a gate of the seventh transistor, a source of the sixth transistor is connected with the outputting terminal of the pre-charging circuit, the inputting terminal of the resetting circuit and the control terminal of the pulling-up circuit, a drain of the sixth transistor is connected with a source of the seventh transistor, and a drain of the seventh transistor is grounded; and the first retaining circuit is connected with the second retaining circuit through a pulling-down node, the pulling-down node is connected to the source and the drain of the one transistor, the source of the fifth transistor, the gate of the sixth transistor and the gate of the seventh transistor.

5. The shift register of claim 1, wherein the pre-charging circuit comprises a first transistor, whose gate is a control terminal, source is an inputting terminal and drain is an outputting terminal.

6. The shift register of claim 1, wherein the resetting circuit comprises a second transistor, whose gate is a control terminal, source is an inputting terminal and drain is an outputting terminal.

7. The shift register of claim 1, wherein the pulling-up circuit comprises a third transistor and a capacitor, a gate of the third transistor is a control terminal, a source thereof is an inputting terminal and a drain thereof is an outputting terminal, the gate and the drain of the third transistor are connected with two terminals of the capacitor, respectively.

8. A gate driving circuit comprising the shift register of claim 1.

9. A display apparatus comprising the gate driving circuit of claim 8.

10. A gate driving method comprises steps of:
pre-charging a pulling-up circuit by a pre-charging circuit (S1);
pulling up a potential of a shift register circuit by the pulling-up circuit, and outputting a high level by the shift register circuit (S2);
resetting the shift register circuit by a resetting circuit (S3); and
retaining an output potential of the shift register circuit by a retaining circuit after the shift register circuit is reset (S4);
wherein an equivalent capacitance of transistor in the retaining circuit varies with the turning on or off of the transistor in the step S4, and the equivalent capacitance when the transistor is turned on is greater than the equivalent capacitance when the transistor is turned off.

11. The gate driving circuit of claim 8, wherein the retaining circuit comprises a first retaining circuit and a second retaining circuit, and the one transistor is disposed in the first retaining circuit.

12. The gate driving circuit of claim 11, wherein the first retaining circuit further comprises a fifth transistor, the gate of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;

the second retaining circuit comprises a fourth transistor, a sixth transistor and a seventh transistor, a gate of the fourth transistor is the second control terminal of the retaining circuit, a source of the fourth transistor is connected with a source of the sixth transistor and the outputting terminal of the pulling-up circuit, a drain of the fourth transistor is grounded, a gate of the sixth transistor is connected with a gate of the seventh transistor, a drain of the sixth transistor is grounded, a source of the seventh transistor is connected with the outputting terminal of the pre-charging circuit, the inputting terminal of the resetting circuit and the control terminal of the pulling-up circuit, and a drain of the seventh transistor is grounded; and the first retaining circuit is connected with the second retaining circuit through a pulling-down node which is connected to the source and the drain of the one transistor, the source of the fifth transistor, the gate of the sixth transistor and the gate of the seventh transistor.

13. The gate driving circuit of claim 11, wherein the first retaining circuit further comprises a fifth transistor, the control terminal of the one transistor is the first control terminal of the retaining circuit, the source and the drain of the one transistor are connected with a source of the fifth transistor, a gate of the fifth transistor is connected with the control terminal of the pulling-up circuit, and a drain of the fifth transistor is grounded;

the second retaining circuit comprises a fourth transistor, a sixth transistor and a seventh transistor, a gate of the fourth transistor is the second control terminal of the retaining circuit, a source of the fourth transistor is connected with a source of the seventh transistor and the outputting terminal of the pulling-up circuit, a drain of the fourth transistor is grounded, a gate of the sixth transistor is connected with a gate of the seventh transistor, a source of the sixth transistor is connected with the outputting terminal of the pre-charging circuit, the inputting terminal of the resetting circuit and the control terminal of the pulling-up circuit, a drain of the sixth transistor is connected with a source of the seventh transistor, and a drain of the seventh transistor is grounded; and the first retaining circuit is connected with the second retaining circuit through a pulling-down node, the pulling-down node is connected to the source and the drain of the one transistor, the source of the fifth transistor, the gate of the sixth transistor and the gate of the seventh transistor.

14. The gate driving circuit of claim 8, wherein the pre-charging circuit comprises a first transistor, whose gate is a control terminal, source is an inputting terminal and drain is an outputting terminal.

15. The gate driving circuit of claim 8, wherein the resetting circuit comprises a second transistor, whose gate is a control terminal, source is an inputting terminal and drain is an outputting terminal.

16. The gate driving circuit of claim 8, wherein the pulling-up circuit comprises a third transistor and a capacitor, a gate of the third transistor is a control terminal, a source thereof is an inputting terminal and a drain thereof is an outputting terminal, the gate and the drain of the third transistor are connected with two terminals of the capacitor, respectively.

* * * * *